United States Patent [19]

Priesemuth

[11] Patent Number: 5,452,190
[45] Date of Patent: Sep. 19, 1995

[54] OPTOELECTRONIC COMPONENT

[76] Inventor: Wolfgang Priesemuth, Postkamp 13, 25524 Breitenburg-Nordoe, Germany

[21] Appl. No.: 94,540

[22] Filed: Jul. 19, 1993

[51] Int. Cl.⁶ .............................................. F21M 3/14
[52] U.S. Cl. .................................... 362/255; 362/800
[58] Field of Search .................... 362/95, 255, 256, 800

[56] References Cited

U.S. PATENT DOCUMENTS

| | | | |
|---|---|---|---|
| 4,698,730 | 10/1987 | Sakai et al. | 362/800 X |
| 4,712,163 | 12/1987 | Oxley | 362/800 X |
| 5,140,220 | 8/1992 | Hasegawa | 362/800 X |
| 5,278,734 | 1/1994 | Ferber | 362/800 X |

FOREIGN PATENT DOCUMENTS

| | | |
|---|---|---|
| 2510267 | 9/1975 | Germany . |
| 7724218 | 8/1977 | Germany . |
| 2722291 | 11/1977 | Germany . |
| 2733937 | 2/1979 | Germany . |
| 3019239 | 11/1981 | Germany . |
| 8707850 | 6/1987 | Germany . |
| 8812039 | 9/1988 | Germany . |

*Primary Examiner*—Stephen F. Husar
*Attorney, Agent, or Firm*—Robert W. Becker & Associates

[57] ABSTRACT

An optoelectronic component with luminescence-emitting properties has an optoelectronic element with a body having at least a section that is at least partially light-transparent for allowing emission of luminescence. The component further has a member having at least a portion that is at least partially light-transparent. The portion of the member encloses the section of the body of the optoelectronic element, whereby the section and the member are in contact with one another by areally resting on one another. Preferably, the member may be injection-molded onto the section of the body. In the alternative, the member may be glued onto the section of the body.

20 Claims, 1 Drawing Sheet

5,452,190

OPTOELECTRONIC COMPONENT

BACKGROUND OF THE INVENTION

The present invention relates to an optoelectronic component having luminescence-emitting properties, comprising an optoelectronic element having a body with contacts which body is at least partially light-transparent for allowing emission of luminescence.

Optoelectronic elements with luminescence-emitting properties, also called light emitting diodes, are semiconductor diodes which spontaneously emit luminescence within the area of the pn transition luminescence. In general, all colors of the visible light spectrum can be emitted by such light emitting diodes (LEDs), depending on the basic substance and doping material, such as red, green and also yellow as a mixed color. It is also technically possible to emit blue light, for example, with silicon carbide; however, blue has not been used commonly due to the low light efficiency. White light cannot be emitted with LEDs because white light has no specific wavelength since it is composed of the different colors of the visible light spectrum.

The limitation to the presently known colors red, green, yellow and, to a certain extent, blue is especially disadvantageous when the excellent properties of LEDs, i.e., low current rating, low current loss due to heat generation, extremely small size, long service life, relatively low production cost, and excellent light yield, are to be used in devices such as vehicles which are to be supplied by the on-board electrical system which has a limited capacity. Especially for illuminating the multitude of switches and the symbols of these switches, used as display devices within vehicles, the aforementioned excellent properties of LEDs are used, and LEDs are therefore employed in great numbers in this field of technology. Despite the undisputed general advantages of LEDs, their use is difficult, and in certain cases it is even impossible, when colors other than red, green, or yellow are desired.

In the past, for example, for the manufacture of the aforementioned switches and display components for the interior of motorized vehicles, it has been suggested to cover the outlet openings of switch elements, through which the light emitted by the LED passes, with complicated cover elements in the desired color so that at least partially the desired color can be achieved during operation of the LED. The resulting complicated switch designs, for example, of actuating elements of switches, keys, etc., which are for example provided with symbols etc. and which, for example, should be visible to the operator at night or in certain emergency situations must be constructed and produced for the aforementioned reasons with extremely complicated manufacturing operations because the light-transparent sections must be connected in a technologically very complicated manner to the non-light-transparent member of, for example, the aforementioned actuating element of a switch, key, etc., and furthermore, the connection must be light-sealing at the connecting edges.

Additionally, the constructive embodiment of such an actuating element that is to be illuminated with an LED has the disadvantage that the light losses are very great because due to deflection and reflection only a small portion of the light originally emitted by the LED will pass through the cover element and is visible to the operator of a motorized vehicle.

It is therefore an object of the present invention to provide an optoelectronic component of the aforementioned kind with which, on the one hand, a desired light color can be adjusted, and, on the other hand, the losses of light which are caused by the light-transparent covering elements, are prevented. Furthermore, the illumination of elements such as switches, keys, etc. is to be constructively improved, and a reduction of the manufacturing cost should be achieved, while at the same time separate cover elements are obsolete.

BRIEF DESCRIPTION OF THE DRAWINGS

This object, and other objects and advantages of the present invention, will appear more clearly from the following specification in conjunction with the accompanying drawings, in which.

SUMMARY OF THE INVENTION

Figure 1:
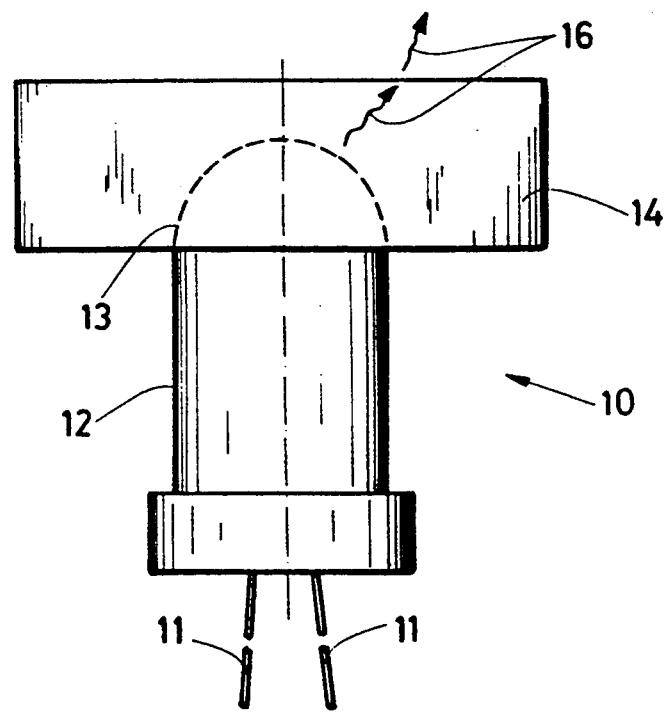
FIG. 1 shows in an enlarged representation a side view of an optoelectronic component in the form of a light-emitting diode (LED) with a light-transparent member being positioned on the body of the (LED)

The optoelectronic component having luminescence-emitting properties according to the present invention is primarily characterized by:

An optoelectronic element having a body having at least a section that is at least partially light-transparent for allowing emission of luminescence; and A member having at least a portion that is at least partially light-transparent, the portion of the member enclosing the section of the body, wherein the section and the member are in contact with one another by areally resting on one another.

Preferably, the member is comprised of plastic material. Expediently, the member is connected to the section of the body by using an injection-molding process.

In an alternative embodiment, the member may be connected to the body with an adhesive layer.

Advantageously, the member has a predetermined color. Preferably, the member has an outer contour in the form of a symbol.

In a preferred embodiment of the present invention, the member has at least one first zone that with respect to a visible outer contour thereof is in the form of a symbol, wherein a second zone of the member surrounding the at least one first zone is non-light-transparent.

The at least one first zone of the member preferably has a predetermined color, the color preferably being white.

In a preferred embodiment of the present invention, the member is white.

The advantage of the inventive solution lies essentially in the fact that the light-transparent member and the body of the LED rest areally on one another and form a unit so that losses of light, known in the prior art from the transfer of light during emission from the LED to the light-transparent member cannot occur. Furthermore, the light-transparent member can surround the body of the LED completely or partially so that the light emitted by the LED is completely transmitted into the light-transparent member, i.e., the emitted light completely penetrates the member. Additionally, this inventive construction is entirely independent of the type of LED because any commercially available LED can be used by correspondingly adapting the light-transparent member to the shape or the body of the LED.

According to a preferred embodiment of the optoelectronic component, the light-transparent member is made of plastic material. However, it is in general possible to use any suitable light-transparent material.

The use of light-transparent plastic however has the advantage that the light-transparent member can be applied by an injection-molding process to the light-transparent section of the body of the LED which, in general, is comprised of glass, a glass-like material, or may be comprised of a light-transparent plastic material. Accordingly, already during manufacture of the light-transparent member a fast and easily producible connection between the light-transparent member and the body of the LED may be generated.

Instead of an injection-nolding process for attaching the light-transparent member to the LED, it is also possible to connect the light-transparent member and the body of the LED by applying an adhesive. This embodiment is commonly used when the body of the LED, due to its specific design, cannot withstand the high temperatures and pressures which occur during an injection-molding process.

Advantageously, the light-transparent member can have a predetermined color so that, depending on the type of application and device, at least partially an illumination with the predetermined color can be achieved.

In another advantageous embodiment of the optoelectronic component, the light-transparent member has an outwardly visible contour in the form of a symbol, i.e., during manufacture of the light-transparent member and/or the generation of the connection to the body of the LED, the light-transparent member can be provided with such an outer contour, for example, during an injection-molding process so that this contour corresponds to the desired symbol. A component embodied in the aforementioned manner can be, for example, in the form of an actuating element of a switch, a key, etc. The aforedescribed manufacture has the advantage that, in General, no further measures must be undertaken to fasten the LED and/or no means must be provided to keep the losses of light to a minimum as with prior art designs with a separate optoelectronic arrangement underneath an actuating member of a switch, key, etc.

In an especially preferred embodiment of the optoelectronic component, the light-transparent member has at least one first zone which, with respect to its outwardly visible contour, is in the form of a symbol, whereby the second zone portion of the member which surrounds the first zone is non-light-transparent. For such a design of the optoelectronic component, the member is entirely or partially formed by an actuating element of a switch, a key etc. whereby in one or a plurality of subsequently performed injection-molding processes in a first step the body of the LED is provided with the light-transparent first zone of the member in the form of a symbol and, subsequently, the non-light-transparent second zone of the member is formed. This embodiment of the optoelectronic component, on the one hand, provides for a very inexpensive manufacture and, on the other hand, allows for the miniaturization of, for example, actuating elements of switches and keys, for example, actuating elements of so-called window lifting switches in vehicles, having one or more illuminated locations.

The light-transparent member advantageously is white, but may be colored in any predetermined other color. This is also true for the embodiment of the optoelectronic component in which only the first zone is light-transparent. In general, in this embodiment it is advantageous to provide the first zone with other predetermined colors.

Another aspect of the present invention concerns a method of manufacturing an optoelectronic component having luminescence-emitting properties. According to the present invention, the method for manufacturing optoelectronic components of the aforementioned kind comprises the step of positioning the member on the section of the body such that the member and the section are in contact with one another by areally resting on one another.

In a preferred embodiment of the inventive method, the member is injection-molded onto the section of the body.

In an alternative embodiment of the inventive method, the member is glued onto the section of the body.

The inventive method further comprises the step of manufacturing the member from plastic material. In a further inventive step the member is colored with a predetermined color.

In another preferred embodiment of the present invention, the method further comprises the step of shaping an outer contour of the member so as to have a symbol.

The inventive method further may comprise the steps of shaping at least one first zone with respect to a visible outer contour of the member so as to be in the form of a symbol, and forming a non-light-transparent second zone at the member surrounding the at least one first zone symbol.

Preferably, the method further comprises the step of coloring the first zone of the member with a predetermined color. Advantageously, the zone is white.

In another embodiment of the present invention, the method further comprises the step of coloring the member white.

DESCRIPTION OF PREFERRED EMBODIMENTS

The present invention will now be described in detail with the aid of several specific embodiments utilizing FIGS. 1 through 3.

The optoelectronic component 10 according to the present invention in general is comprised of an optoelectronic element with luminescence-emitting properties which in general is referred to as a light emitting diode (LED) 12. By supplying an operating voltage to the LED 12, the semiconductor diode is excited in the known manner to spontaneously emit luminescence within the area of the pn transition. This is a commonly known phenomenon and need not be discussed further. LEDs are commercially available in various constructive designs so that the LED represented in FIG. 1 in a side view, approximately enlarged 10 times, is only to be viewed as an exemplary representation, i.e., without imparting any limiting constructive character to the optoelectronic component 10 represented in FIG. 1.

The optoelectronic element (LED) 10 has a body 12 which, in general, is partially or completely comprised of light-transparent plastic and has two contacts 11 which, in a known manner serve to supply voltage to the device. In the suggested inventive optoelectronic component 10 the light-transparent section 13 of the body 12 of the LED is at least partially provided with an at least partially light-transparent element. The light-transparent section 13 of the body 12 and the member 14 rest areally on one another such that both the transparent section 13 and the member 14 have contact with one another without a gap being present between the abutting (contacting) surfaces.

Light 16, exiting the body 12 at the outlet side, can therefore enter directly the light-transparent member 14 and, as shown in FIG. 1, exit the member 14. The light-transparent member 14 may be comprised of plastic material that is injection-moldable so that, by using an injection molding process, the member 14 can be directly applied to the light-transparent section 13 of the body 12. Aaccordingly, with this process the light-transparent member 14 and the optoelectronic element (LED) can be produced as a unit.

Figure 2:
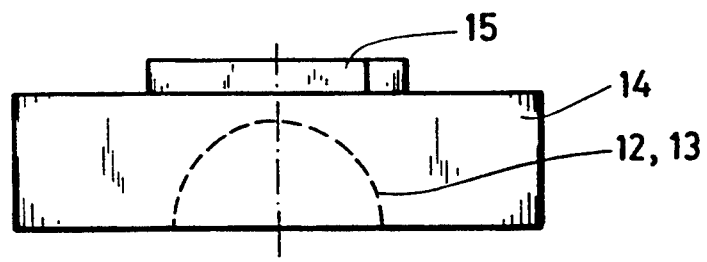
FIG. 2 shows an advantageous embodiment of an optoelectronic component in a side view according to FIG. 1 wherein the optoelectronic element (LED) has been omitted and the light-transmitting member, at least with respect to the outwardly visible contour, is embodied in the form of a symbol.

In the embodiment represented in FIG. 2 the optoelectronic element (LED) has been omitted. The light-transparent member 14 is represented in a side view and it is shown that the member 14 has an outer contour in the form of a symbol 15, here in the form of an arrow shown in FIG. 3. FIG. 3 is a representation rotated about 90° relative to the representation of FIG. 2. The light-transparent member 14, for example, may be white so that, to a certain extent, the light 16 exiting from the light-transparent element 14 has a white light component. In general, any desired color may be chosen for the embodiment of the light-transparent member, independent of an embodiment according to FIG. 1 or according to FIGS. 2 and 3.

Figure 3:
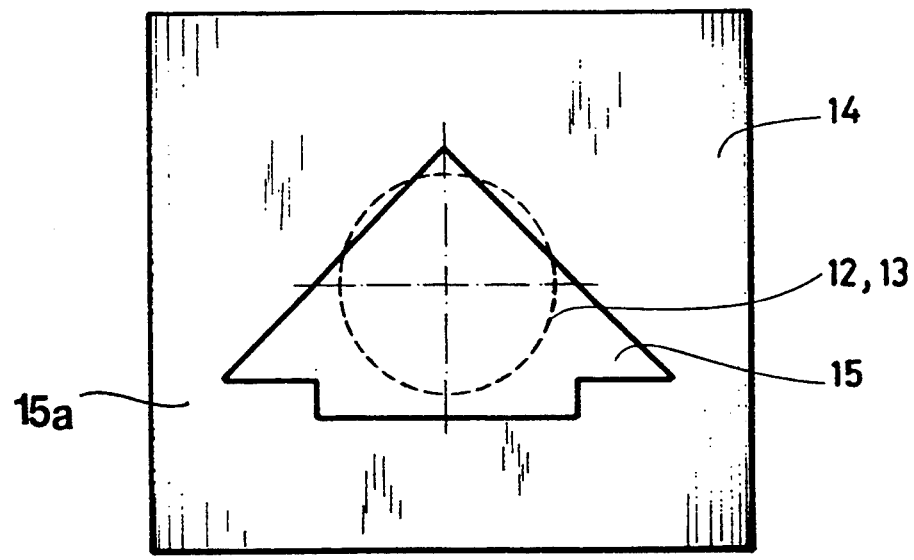
FIG. 3 shows a plan view of the light-transparent member of in FIG. 2 in a representation rotated about 90°.

With respect to the representation of the optoelectronic component 10 according to FIGS. 2 and 3 it should be noted that the light-transparent element 14 may also be embodied such that it has at least one first zone which with respect to the outwardly visible contour is in the form of a symbol 15 while the portion (second zone) of the element 14 surrounding the first zone is non-light-transparent, i.e., in the representation according to FIG. 3 the area 15a of the element 14 outside of the symbol 15. In this embodiment it is then also possible that the light-transparent member 14, i.e., the symbol 15 proper can be extended downwardly, compare FIG. 2, toward the optoelectronic element 12 (not represented), so that the optoelectronic element 12 releases the light directly into the light-transparent zone of the member 14, i.e., into the first zone of the symbol 15, while the second zone 15a surrounding the symbol is non-light-transparent.

It should be further noted that the shape of the member 14 which is at least partially light-transparent may be embodied in any desired and suitable form, i.e., the represented shapes should be viewed as schematic representations of the member 14 only without limiting the embodiment of the member 14 to the illustrated shapes. For example, the member 14 can be an actuating element of a so-called window lifting switch known, for example, in the automotive industry for lifting and lowering windows in vehicles.

The present invention is, of course, in no way restricted to the specific disclosure of the specification and drawings, but also encompasses any modifications within the scope of the appended claims.

What I claim is:

1. An optoelectronic component having luminescence-emitting properties, comprising:
    an optoelectronic element having a body having at least a section that is at least partially light-transparent for allowing emission of luminescence; and
    a member having at least a portion that is at least partially light-transparent, said portion of said member enclosing said section of said body, wherein said portion of said member enclosing said section of said body has a shape mating with the shape of said section such that said portion and said section are in contact with one another by areally resting on one another without a gap therebetween.

2. An optoelectronic component according to claim 1, wherein said member is comprised of plastic material.

3. An optoelectronic component according to claim 2, wherein said member is connected to said section of said body by using an injection-molding process.

4. An optoelectronic component according to claim 1, further comprising an adhesive layer between said member and said body for connecting said member to said body.

5. An optoelectronic component according to claim 1, wherein said member has a predetermined color.

6. An optoelectronic component according to claim 1, wherein said member has an outer contour in the form of a symbol.

7. An optoelectronic component according to claim 1, wherein said member has at least one first zone that with respect to a visible outer contour thereof is in the form of a symbol, wherein a second zone of said member surrounding said at least one first zone is non-light-transparent.

8. An optoelectronic component according to claim 7, wherein said at least one first zone of said member has a predetermined color.

9. An optoelectronic component according to claim 7, wherein said at least one first zone is white.

10. An optoelectronic component according to claim 1, wherein said member is white.

11. A method of manufacturing an optoelectronic component having luminescence-emitting properties, the optoelectronic component comprising a body having at least a section that is at least partially light-transparent for allowing emission of luminescence and a member having at least a portion that is at least partially light-transparent, said portion of said member enclosing said section of said body; said method comprising the step of:
    positioning said member on said section such that said member and said section are in contact with one another by areally resting on one another without a gap therebetween.

12. A method according to claim 11, further comprising the step of injection-molding said member onto said section of said body.

13. A method according to claim 11, further comprising the step of gluing said member onto said section of said body.

14. A method according to claim 11, further comprising the step of manufacturing said member from plastic material.

15. A method according to claim 11, further comprising the step of coloring said member with a predetermined color.

16. A method according to claim 11, further comprising the step of shaping an outer contour of said member so as to have a symbol.

17. A method according to claim 11, further comprising the steps of:

shaping at least one first zone on said member, said at least one first zone with respect to a visible outer contour thereof being in the form of a symbol, wherein a second zone of said member surrounding said at least one first zone is non-light-transparent; and forming a non-light-transparent second zone at said member surrounding said at least one first zone.

18. A method according to claim 17, further comprising the step of coloring said at least one first zone with a predetermined color.

19. An optoelectronic component according to claim 17, further comprising the step of coloring said at least one first zone white.

20. An optoelectronic component according to claim 1, further comprising the step of coloring said member white.

* * * * *